(12) United States Patent
Bajuri et al.

(10) Patent No.: US 12,205,874 B2
(45) Date of Patent: Jan. 21, 2025

(54) SEMICONDUCTOR PACKAGE WITH WIRE BOND JOINTS

(71) Applicant: Infineon Technologies AG, Neubiberg (DE)

(72) Inventors: Mohd Kahar Bajuri, Melaka (MY); Joel Feliciano Del Rosario, Malacca (MY); Thai Kee Gan, Melaka (MY); Mohd Afiz Hashim, Shah Alam (MY); Mei Fen Hiew, Melaka (MY)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 18/529,308

(22) Filed: Dec. 5, 2023

(65) Prior Publication Data

US 2024/0105564 A1    Mar. 28, 2024

Related U.S. Application Data

(62) Division of application No. 17/243,056, filed on Apr. 28, 2021, now Pat. No. 11,842,953.

(51) Int. Cl.
*H01L 23/48* (2006.01)
*H01L 23/00* (2006.01)
*H01L 23/495* (2006.01)
*H01L 23/532* (2006.01)

(52) U.S. Cl.
CPC .. *H01L 23/49575* (2013.01); *H01L 23/49562* (2013.01); *H01L 23/53228* (2013.01); *H01L 24/40* (2013.01); *H01L 2224/37147* (2013.01)

(58) Field of Classification Search
CPC .......... H01L 2224/37147; H01L 24/40; H01L 23/53228; H01L 23/49562; H01L 23/49575
See application file for complete search history.

(56) References Cited

U.S. PATENT DOCUMENTS

| | | | | |
|---|---|---|---|---|
| 5,132,772 | A | * | 7/1992 | Fetty ................. H01L 23/49517 257/E23.032 |
| 2002/0125562 | A1 | | 9/2002 | Crowley et al. |
| 2003/0075785 | A1 | | 4/2003 | Crowley et al. |
| 2006/0012055 | A1 | | 1/2006 | Foong et al. |

(Continued)

FOREIGN PATENT DOCUMENTS

| | | |
|---|---|---|
| WO | 2011117939 A1 | 9/2011 |
| WO | 2020127442 A2 | 6/2020 |

*Primary Examiner* — Hoa B Trinh
(74) *Attorney, Agent, or Firm* — Murphy, Bilak & Homiller, PLLC

(57) ABSTRACT

A semiconductor package includes: a semiconductor die attached to a leadframe and having a first bond pad at a side of the semiconductor die facing away from the leadframe; a metal clip having a first bonding region attached to the first bond pad of the semiconductor die by a plurality of first wire bonds which extend through a plurality of first openings in the first bonding region of the metal clip, the plurality of first wire bonds forming a joint between the metal clip and the first bond pad of the semiconductor die; and a joint between the plurality of first wire bonds and the metal clip at a side of the metal clip facing away from the semiconductor die. Additional semiconductor package embodiments and related methods of manufacture are also described.

20 Claims, 10 Drawing Sheets

(56) References Cited

U.S. PATENT DOCUMENTS

| | | |
|---|---|---|
| 2007/0075406 A1* | 4/2007 | Ho .................... H01L 24/37 |
| | | 257/E23.044 |
| 2009/0008775 A1 | 1/2009 | Tanaka et al. |
| 2014/0361420 A1 | 12/2014 | Yilmaz et al. |
| 2017/0338190 A1 | 11/2017 | Fujino et al. |
| 2019/0311975 A1 | 10/2019 | Choi et al. |
| 2020/0176342 A1 | 6/2020 | Choi et al. |
| 2021/0091054 A1 | 3/2021 | Apelsmeier et al. |
| 2022/0352056 A1 | 11/2022 | Bajuri et al. |

* cited by examiner

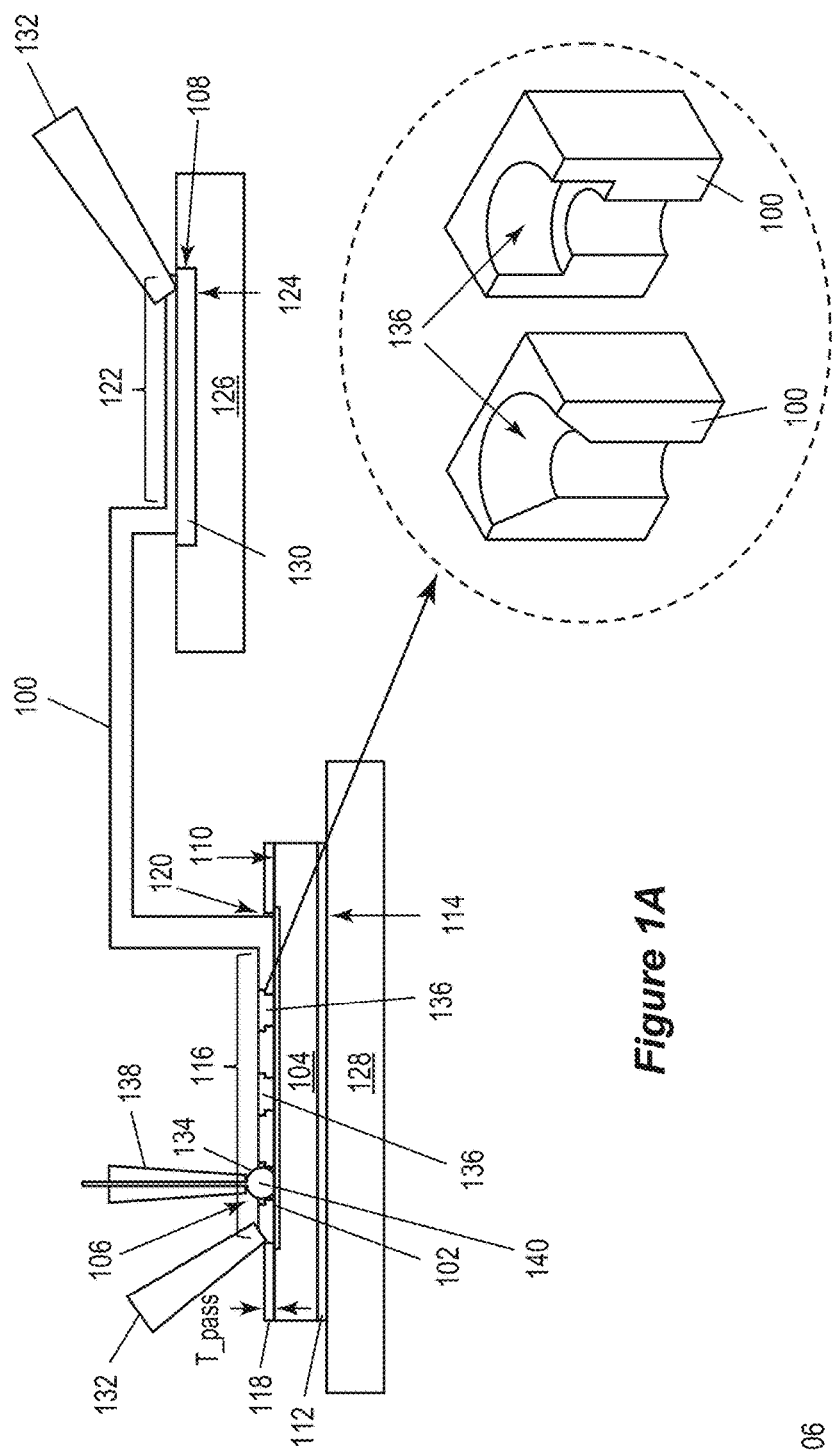
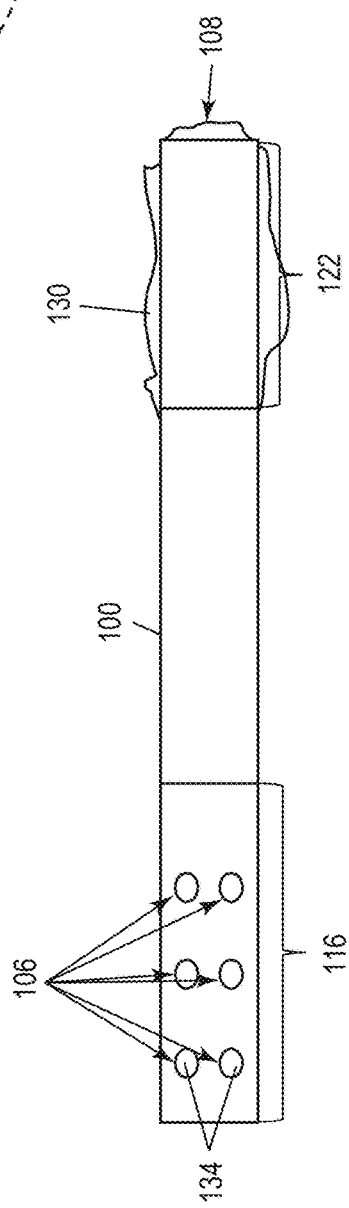
*Figure 1A*
*Figure 1B*

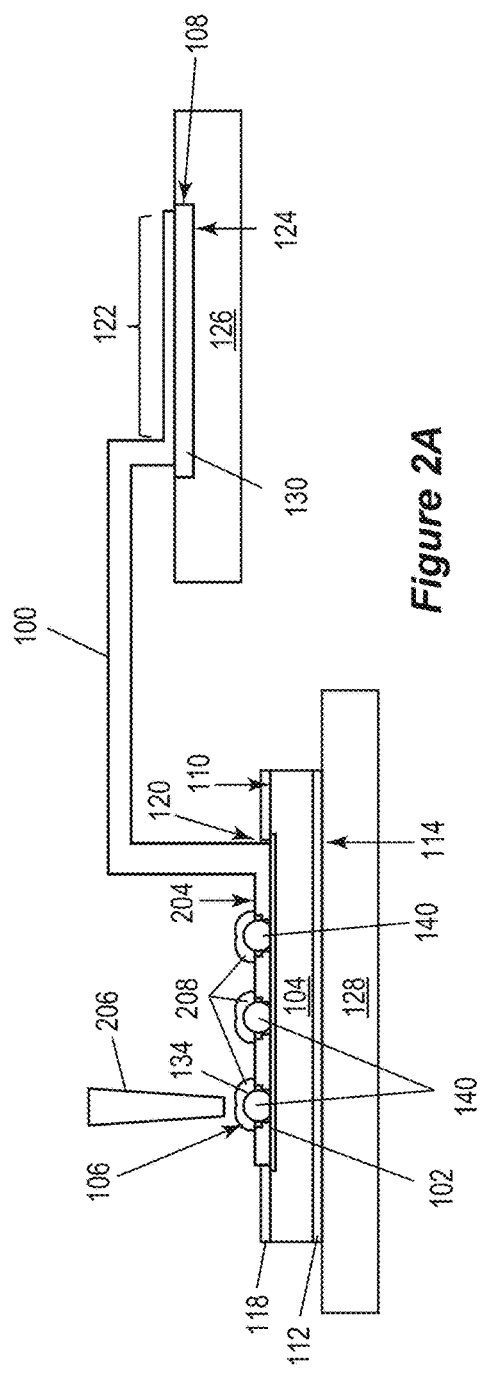
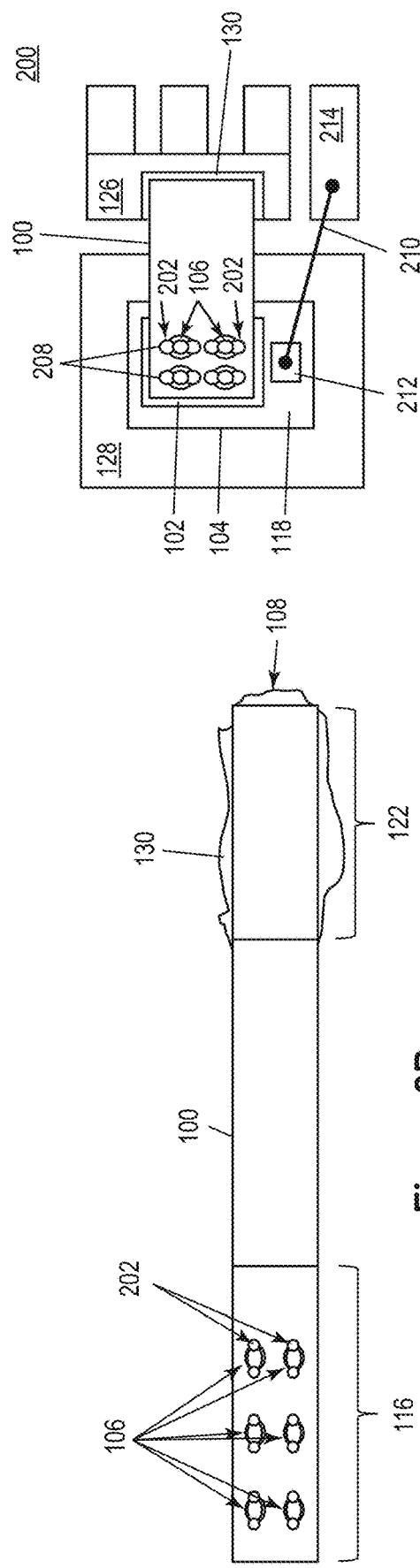
Figure 2A
Figure 2B
Figure 2C

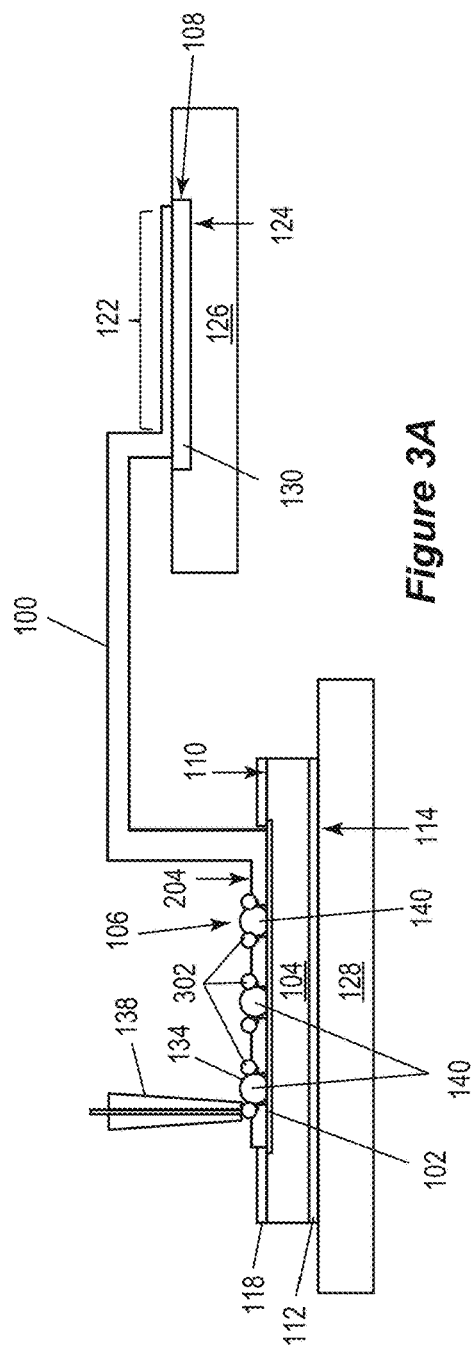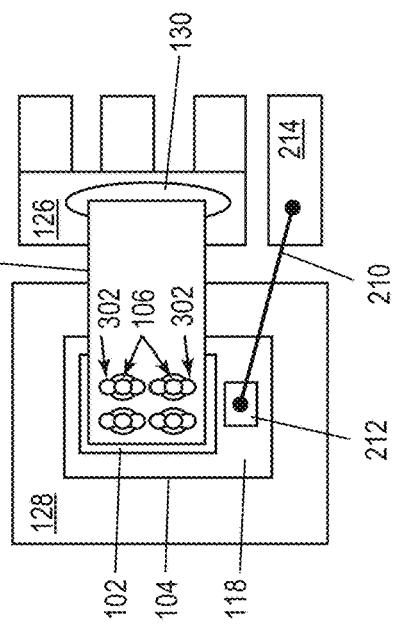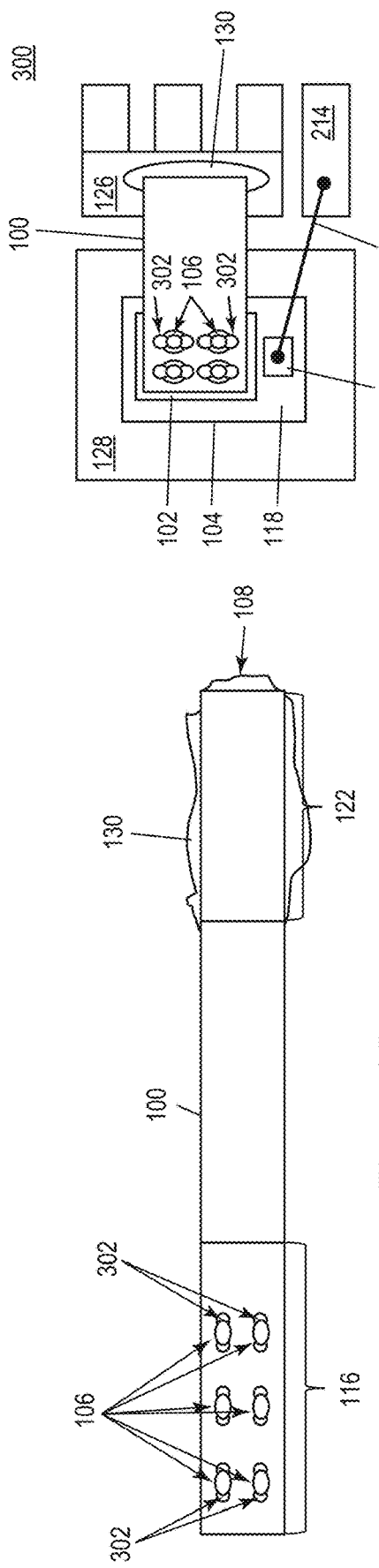
Figure 3A
Figure 3C
Figure 3B

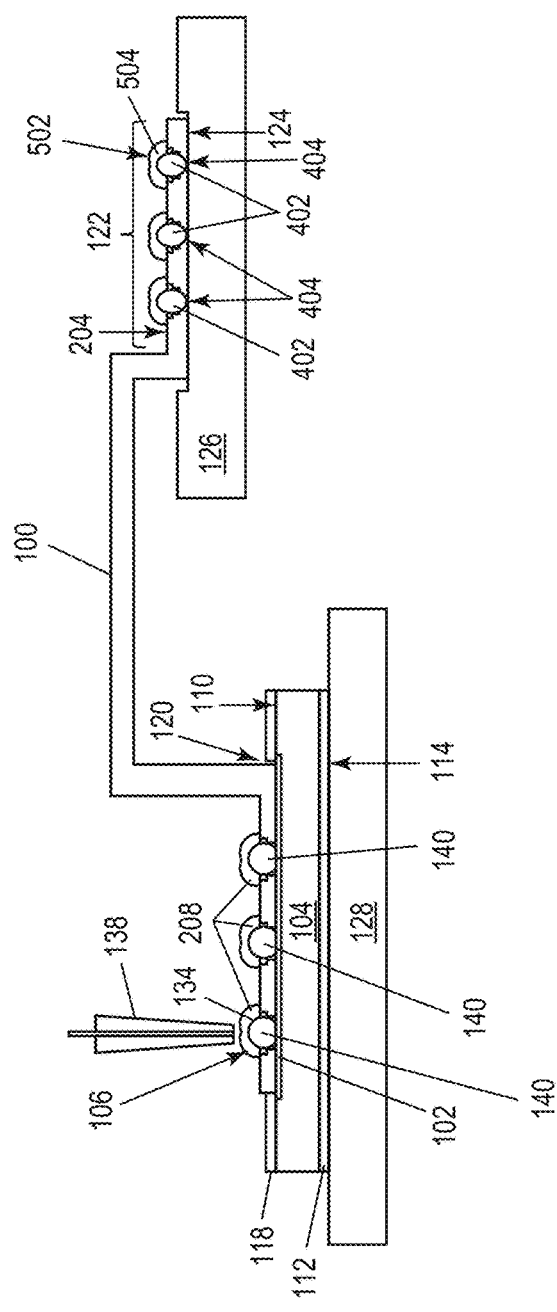
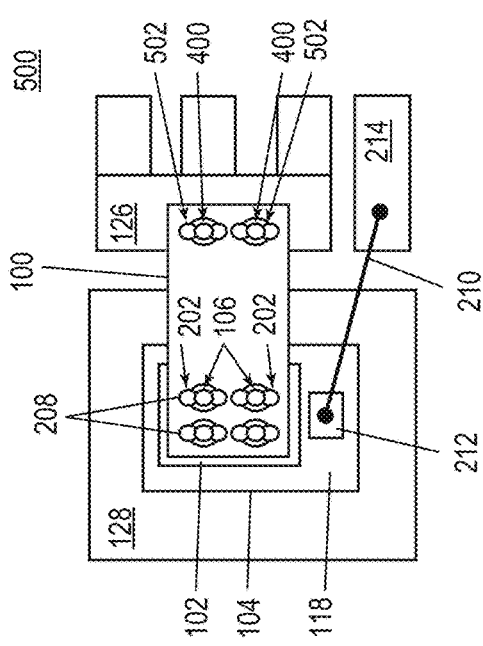
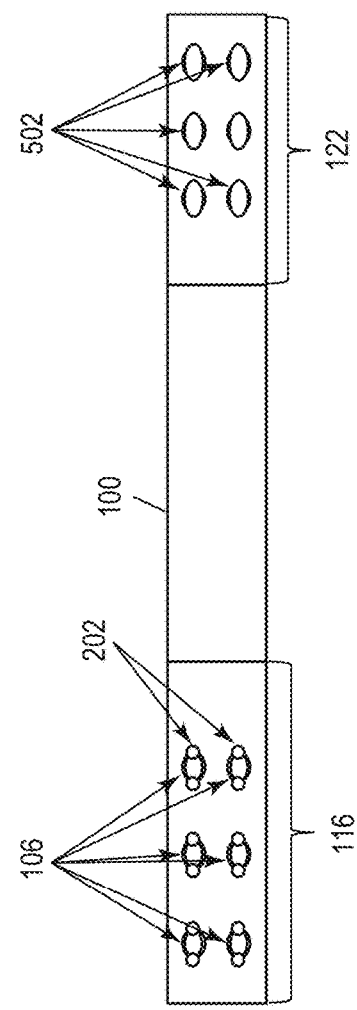
*Figure 5A*
*Figure 5B*
*Figure 5C*

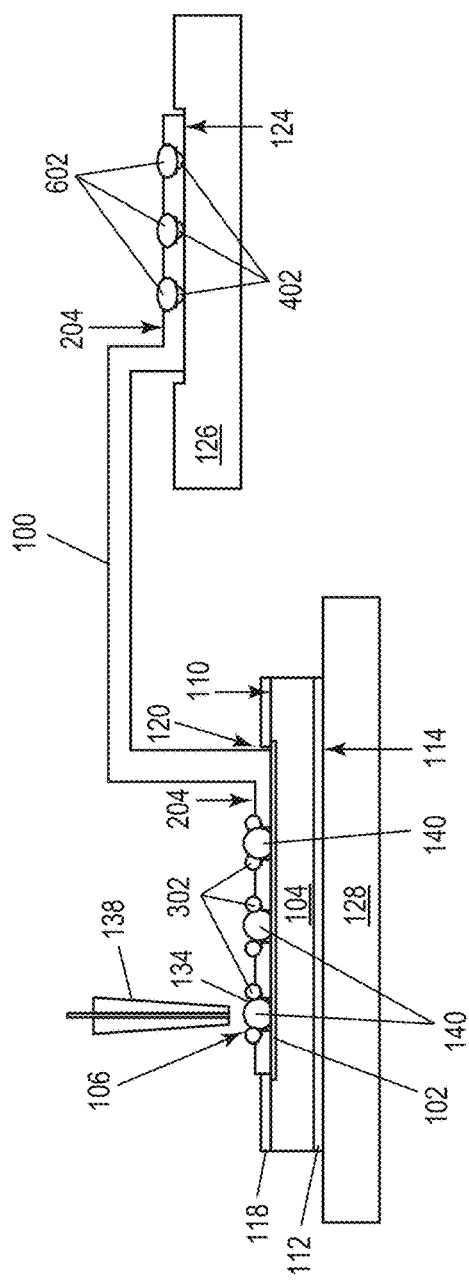
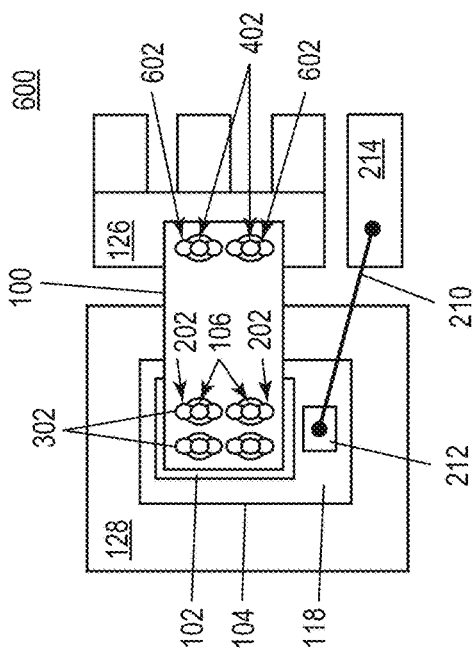
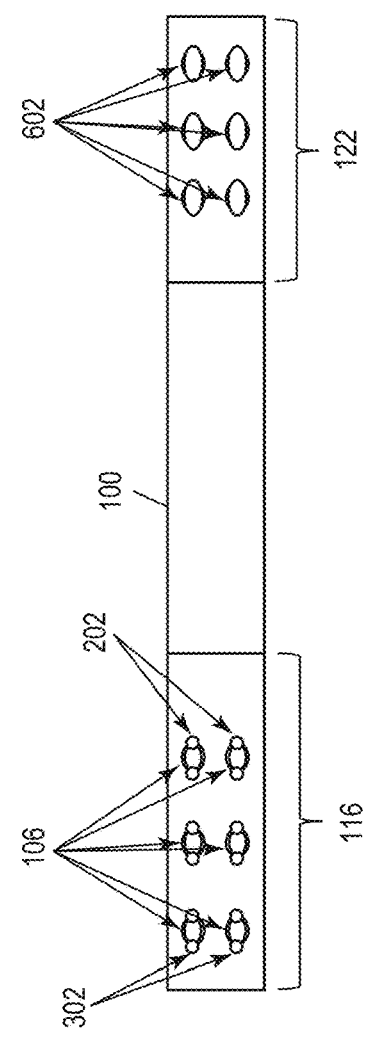
*Figure 6A*
*Figure 6B*
*Figure 6C*

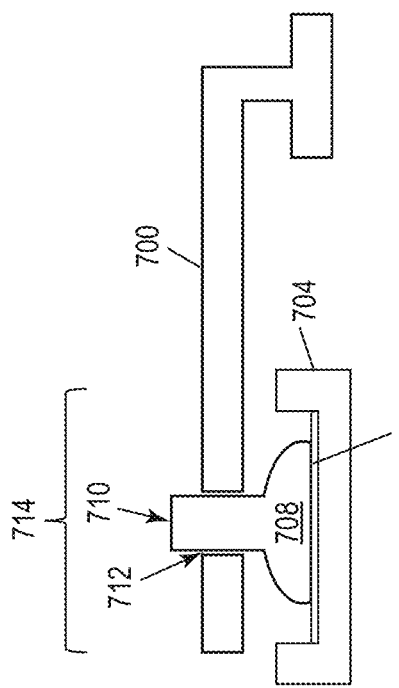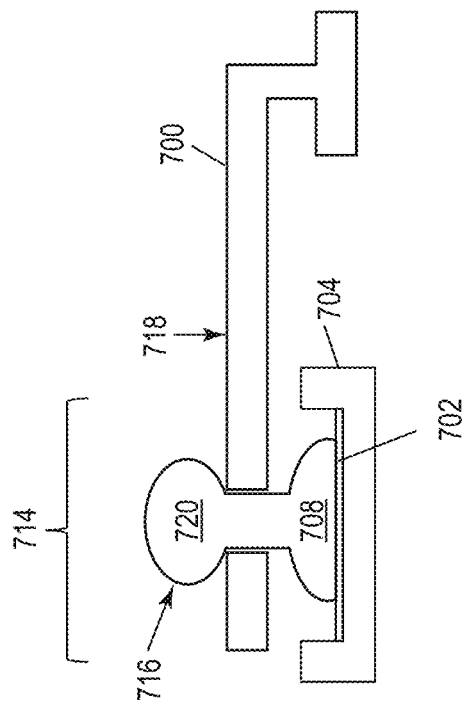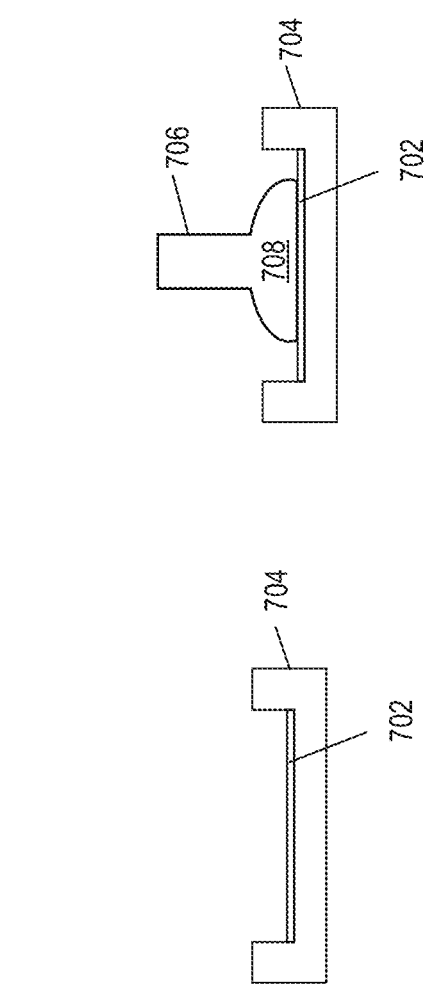

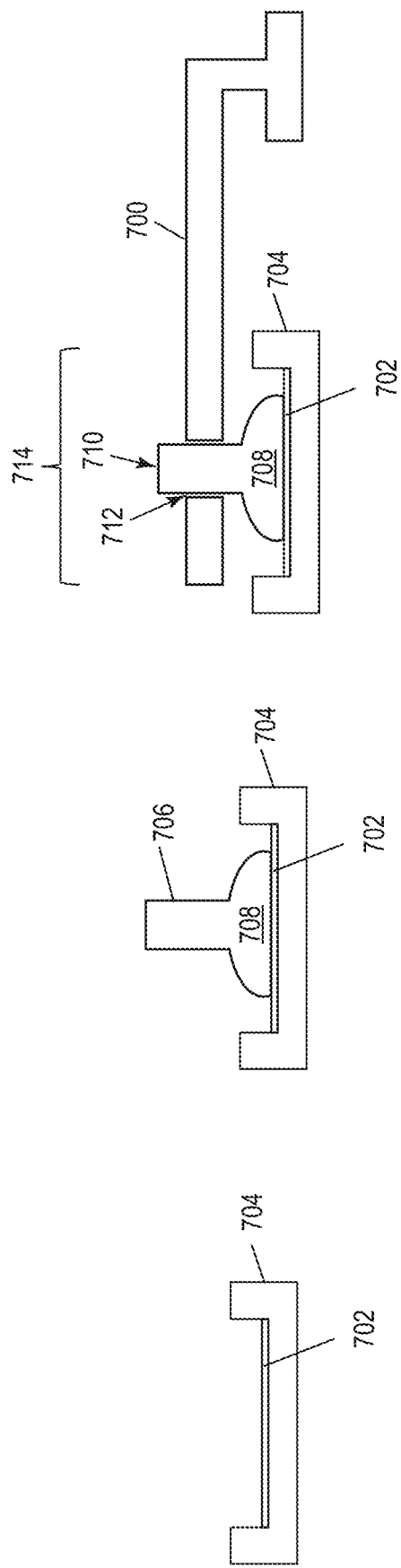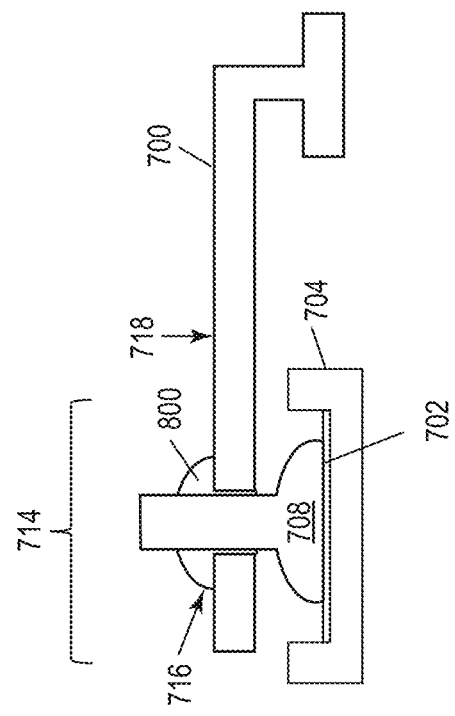

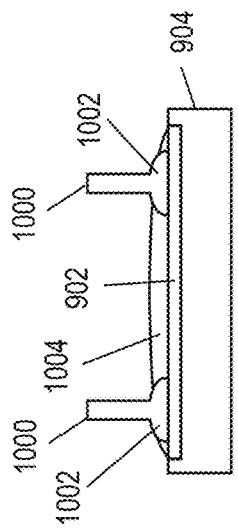
Figure 10A
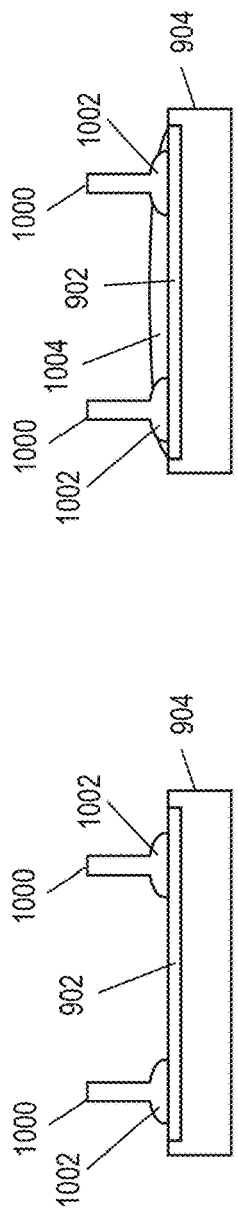
Figure 10B
Figure 10C
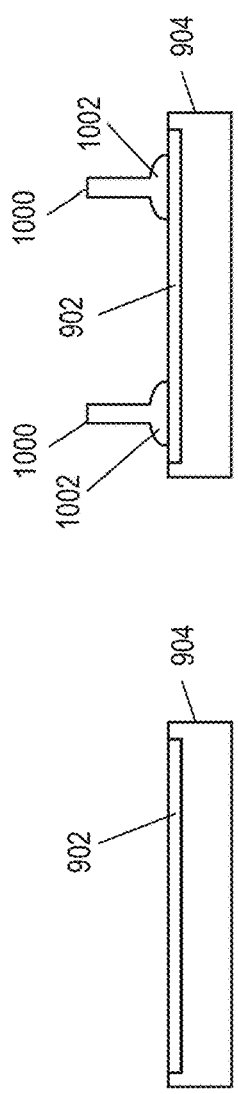
Figure 10D
Figure 10E

SEMICONDUCTOR PACKAGE WITH WIRE BOND JOINTS

BACKGROUND

Power semiconductor technologies such as SiC and GaN allow for smaller bond pad sizes (e.g., up to 30% smaller compared to Si) with higher current density. The feasibility of conventional solder technology for attaching metal clips to such small bond pads has not been proven. Solder paste may be used with smaller bond pads but suffers from pad contamination issues and residues from cleaning. Bond pads are typically surrounded by a passivation such as polyimide which delimits an opening for attaching a connector such as a wire bond or metal clip to the bond pad. With conventional wire and wedge bond technologies there is a risk of dented passivation and wire lift-off, especially for thin bond wires with small bond pad openings if there is angle bond. Also, the bond pad opening design is limited for certain Al wire bond sizes. For gate pad connections, a small Cu clip to gate pad opening limits the size of the gate pad opening for Cu clips. Furthermore, a small process window for clip placement alignment to source/gate area leads to yield and performance losses caused by clip offset.

Thus, there is a need for an improved method of attaching a metal clip to a semiconductor die and related semiconductor package designs.

SUMMARY

According to an embodiment of a method of attaching a metal clip to a semiconductor die, the method comprises: aligning a first bonding region of the metal clip with a first bond pad of the semiconductor die; and while the first bonding region of the metal clip is aligned with the first bond pad of the semiconductor die, forming a plurality of first wire bonds to the first bond pad of the semiconductor die through a plurality of openings in the first bonding region of the metal clip, the plurality of first wire bonds forming a joint between the metal clip and the first bond pad of the semiconductor die.

According to an embodiment of a semiconductor package, the semiconductor package comprises: a semiconductor die attached to a leadframe and having a first bond pad at a side of the semiconductor die facing away from the leadframe; a metal clip having a first bonding region attached to the first bond pad of the semiconductor die by a plurality of first wire bonds to the first bond pad of the semiconductor die and which extend through a plurality of first openings in the first bonding region of the metal clip, the plurality of first wire bonds forming a joint between the metal clip and the first bond pad of the semiconductor die; and a joint between the plurality of first wire bonds and the metal clip at a side of the metal clip facing away from the semiconductor die.

According to another embodiment of a method of attaching a metal clip to a semiconductor die, the method comprises: forming one or more first wire bonds to a first bond pad of the semiconductor die; inserting a distal end of each first wire bond through a corresponding opening in a first bonding region of the metal clip; and after inserting the distal end of each first wire bond through the corresponding opening in the first bonding region of the metal clip, forming a joint between each first wire bond and the metal clip at a side of the metal clip facing away from the semiconductor die.

According to another embodiment of a semiconductor package, the semiconductor package comprises: a semiconductor die attached to a leadframe and having a first bond pad at a side of the semiconductor die facing away from the leadframe; a metal clip; one or more first wire bonds to the first bond pad of the semiconductor die, a distal end of each first wire bond extending through a corresponding opening in a first bonding region of the metal clip; and a joint between each first wire bond and the metal clip at a side of the metal clip facing away from the semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B illustrate an embodiment of a method of attaching a metal clip to a first bond pad of a semiconductor die, where FIG. 1A shows a cross-sectional view during the method and FIG. 1B shows a top plan view of just the metal clip and resulting joints.

FIGS. 2A through 2C illustrate another embodiment of a method of attaching a metal clip to a first bond pad of a semiconductor die, where FIG. 2A shows a cross-sectional view during the method, FIG. 2B shows a top plan view of just the metal clip and resulting joints, and FIG. 2C shows a top plan view of the resulting semiconductor package.

FIGS. 3A through 3C illustrate another embodiment of a method of attaching a metal clip to a first bond pad of a semiconductor die, where FIG. 3A shows a cross-sectional view during the method, FIG. 3B shows a top plan view of just the metal clip and resulting joints, and FIG. 3C shows a top plan view of the resulting semiconductor package.

FIG. 4A shows a cross-sectional view during the method and FIG. 4B shows a top plan view of just the metal clip and resulting joints.

FIGS. 5A through 5C illustrate another embodiment of a method of attaching a metal clip to a first bond pad of a semiconductor die, where FIG. 5A shows a cross-sectional view during the method, FIG. 5B shows a top plan view of just the metal clip and resulting joints, and FIG. 5C shows a top plan view of the resulting semiconductor package.

FIGS. 6A through 6C illustrate another embodiment of a method of attaching a metal clip to a first bond pad of a semiconductor die, where FIG. 6A shows a cross-sectional view during the method, FIG. 6B shows a top plan view of just the metal clip and resulting joints, and FIG. 6C shows a top plan view of the resulting semiconductor package.

FIGS. 7A through 7D illustrate respective cross-sectional views during different stages of an embodiment of a method of attaching a metal clip to a first bond pad of a semiconductor die.

FIGS. 8A through 8D illustrate respective cross-sectional views during different stages of another embodiment of a method of attaching a metal clip to a first bond pad of a semiconductor die.

FIGS. 10A through 10E illustrate respective cross-sectional views during different stages of an embodiment of a method of attaching a first metal clip to the first bond pad of the semiconductor die shown in FIG. 9, where the semiconductor die is a power semiconductor die and the first bond pad is a source pad.

DETAILED DESCRIPTION

Figure 4A:
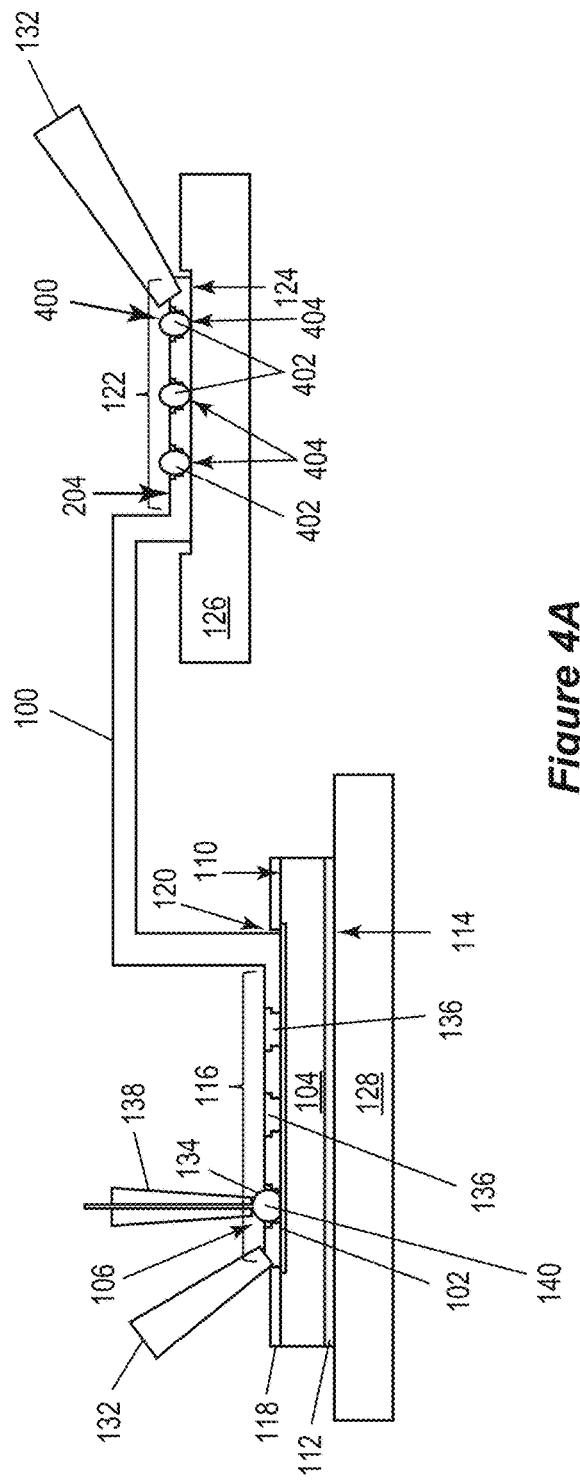
FIGS. 4A and 4B illustrate another embodiment of a method of attaching a metal clip to a first bond pad of a semiconductor die, where

The embodiments described herein provide an improved method of attaching a metal clip to a bond pad of a semiconductor die, and related semiconductor package designs. The methods described herein include using one or more wire bonds to form a joint between a metal clip and a bond pad of a semiconductor die. Semiconductor packages produced from the methods described herein are also described.

Described next, with reference to the figures, are exemplary embodiments of the methods of attaching a metal clip to a bond pad of a semiconductor die and related semiconductor package designs.

FIGS. 1A and 1B illustrate an embodiment of a method of attaching a metal clip 100 such as a Cu clip to a first bond pad 102 of a semiconductor die 104. FIG. 1A shows a cross-sectional view during the method. FIG. 1B shows a top plan view of just the metal clip 100 and resulting joints 106, 108.

The semiconductor die 104 may be a logic die such as a processor die, memory die, etc., a power semiconductor die such as a power transistor die, a power diode die, a half bridge die, etc., or a die that combines logic and power devices on the same semiconductor substrate. In one embodiment, the semiconductor die 104 is a vertical semiconductor die having a primary current path between a first power contact pad 102 at a first side 110 of the semiconductor die 104 and a second power contact pad 112 at a second side 114 of the die 104 opposite the first side 110. Examples of vertical power semiconductor dies include but are not limited to power Si MOSFETs (metal-oxide-semiconductor field-effect transistors), IGBTs (insulated-gate bipolar transistors), SiC MOSFETs, GaN HEMTs (high-electron mobility transistors), etc.

The clip attachment method illustrated in FIGS. 1A and 1B includes aligning a first bonding region 116 of the metal clip 100 with the first bond pad 102 of the semiconductor die 104. A passivation layer 118 such as polyimide may laterally surround the first bond pad 102 of the semiconductor die 104 and have an opening 120 which exposes part or all of the first bond pad 102. In one embodiment, the first bonding region 116 of the metal clip 100 is aligned with the first bond pad 102 of the semiconductor die 104 by seating the first bonding region of the metal clip in the opening 120 of the passivation layer 118. Preferably, the thickness 'T pass' of the passivation layer 118 is chosen to perform a function of confining the first bonding region 116 of the metal clip 100 within the first bond pad 102 during the process of forming first wire bonds described in the succeeding paragraphs. By way of example, the passivation layer 118 may have a thickness of at least 20 μm or 10% of the metal clip 100 thickness. The thickness of the passivation layer 118 may also be sufficient to confine the first bonding region 116 during the formation of additional joints between the first wire bonds and the metal clip 100.

Separately or in combination, a second bonding region 122 of the metal clip 100 may be seated in an alignment feature 124 of a metal lead 126 of a leadframe. The alignment feature 124 may be a recess, downset, etc. for aligning the metal clip 100. The semiconductor die 104 may be attached to a part 128 of the leadframe that is separate and spaced apart from the metal lead 126.

In one embodiment, the second bonding region 122 of the metal clip 100 may be soldered to the metal lead 126 using a solder material 130 such as a pre-form solder tape, solder paste, etc. With this approach, the metal clip 100 is secured in place by a solder joint 108 on the lead side before the clip 100 is attached to the semiconductor die 104. The metal clip 100 may be held in place by a securing device 132 such as clips during the soldering of the second bonding region 122 of the metal clip 100 to the metal lead 126.

The clip attachment method illustrated in FIGS. 1A and 1B further includes, while the first bonding region 116 of the metal clip 100 is aligned with the first bond pad 102 of the semiconductor die 104, forming first wire bonds 134 to the first bond pad 102 through openings 136 in the first bonding region 116 of the metal clip 100. As explained above, the clip alignment may be provided by the opening 120 in the passivation layer 118 and/or by the solder joint 108 that joins the metal clip 100 to the metal lead 126.

A standard wire bonding apparatus 138 may be used to form the first wire bonds 134 formed through the openings 136 in the first bonding region 116 of the metal clip 100. The securing device 132 may be used to press the metal clip 100 downward while the wire bonding process.

The first wire bonds 134 may be ball or wedge bonds. That is, the proximal end 140 of the first wire bonds 134 may be ball-shaped or wedge-shaped.

In the case of ball bonds, the wire bonding apparatus 138 is a capillary assist tool. A free ball at the proximal end 140 of the first wire bonds 134 is deformed when the capillary assist tool presses toward the surface of the bond pad 102 and applies force and possibly ultrasonics with a given amount of time to deform the ball. Each deformed ball end 140 occupies a corresponding opening 136 in the first bonding region 116 of the metal clip 100 to secure the clip 100 to the die bond pad 102.

In the case of wedge bonds, which includes both wire and ribbon bonds, the wire bonding apparatus 138 is a wedge tool. Ultrasonic energy and pressure are used to create a bond between the wire 134 and the die bond pad 102. The wire is deformed into a flat elongated shape of a wedge or ribbon, depending on the type of wedge tool used, and each deformed wire end 140 occupies a corresponding opening 136 in the first bonding region 116 of the metal clip 100 to secure the clip 100 to the die bond pad 102.

In either case, the first wire bonds 134 form a joint 106 between the metal clip 100 and the first bond pad 102 of the semiconductor die 104 without using solder. Accordingly, the interface between the first bonding region 116 of the metal clip 100 and the first bond pad 102 of the semiconductor die 104 is solder free.

The enlarged view provided in FIG. 1A shows exemplary contemplated configurations for the openings 136 in the first bonding region 116 of the metal clip 100. Both the countersunk configuration and the counterbored configuration visible in the enlarged view for accept the ball/wedge head 140 of the first wire bonds 134 to enhance locking between the first wire bonds 134, the metal clip 100 and the first bond pad 102 of the semiconductor die 104. Other configurations for the openings 136 may be used, and the sidewalls of the openings 136 may have surface features such as ridges, grooves, etc. that further enhance locking.

FIGS. 2A through 2C illustrate another embodiment of a method of attaching a metal clip 100 to a first bond pad 102 of a semiconductor die 104. FIG. 2A shows a cross-sectional view during the method. FIG. 2B shows a top plan view of just the metal clip 100 and resulting joints 106, 108. FIG. 2C shows a top plan view of the resulting semiconductor package 200, which may or may not be a molded package (molding compound is not shown in FIG. 2C to not obstruct most of the package components).

The method illustrated in FIGS. 2A through 2C is similar to the method illustrated in FIGS. 1A and 1B. Different, however, the method illustrated in FIGS. 2A through 2C further includes, after forming the solder-free joint 106 between the metal clip 100 and the first bond pad 102 of the semiconductor die 104, forming a joint 202 between the first wire bonds 134 and the metal clip 100 at a side 204 of the metal clip 100 facing away from the semiconductor die 104. As shown in FIG. 2A, the additional joint 202 may be a solder joint formed using a solder deposition tool 206 such as a solder printer that deposits solder 208 on each one of the first wire bonds. The solder 208 also extends onto the top side 204 of the metal clip 100. The solder 208 is reflowed or otherwise processed to form the soldered joint 202 which reinforces the underlying solder-free joint 106.

In one embodiment, the semiconductor package 200 shown in FIG. 2C is a semiconductor package 200 and the semiconductor die 104 is a power semiconductor die such as a Si MOSFET, IGBT, SiC MOSFET, GaN HEMT, etc. According to this embodiment, the first die bond pad 102 may be a source pad or an emitter pad and the second die bond pad 112 may be a drain pad or a collector pad. A wire bond connection 210 may be formed between a gate pad 212 of the die 104 which is at the same side 110 of the die 104 as the source/emitter pad and a corresponding lead 214 of a leadframe.

FIGS. 3A through 3C illustrate another embodiment of a method of attaching a metal clip 100 to a first bond pad 102 of a semiconductor die 104. FIG. 3A shows a cross-sectional view during the method. FIG. 3B shows a top plan view of just the metal clip 100 and resulting joints 106, 108. FIG. 3C shows a top plan view of the resulting semiconductor package 300, which may or may not be a molded package (molding compound is not shown in FIG. 2C to not obstruct most of the package components).

The method illustrated in FIGS. 3A through 3C is similar to the method illustrated in FIGS. 2A through 2C. Different, however, the joint 202 between the first wire bonds 134 and the metal clip 100 at the side 204 of the metal clip 100 facing away from the semiconductor die 104 is a wire bond joint instead of a solder joint. The joint 202 is formed by forming one or more additional wire bonds 302 between each one of the first wire bonds 134 and the metal clip 100 at the side 204 of the metal clip 100 facing away from the semiconductor die 102. A standard wire bonding apparatus 138 may be used to form the second wire bonds 302.

Figure 4B:
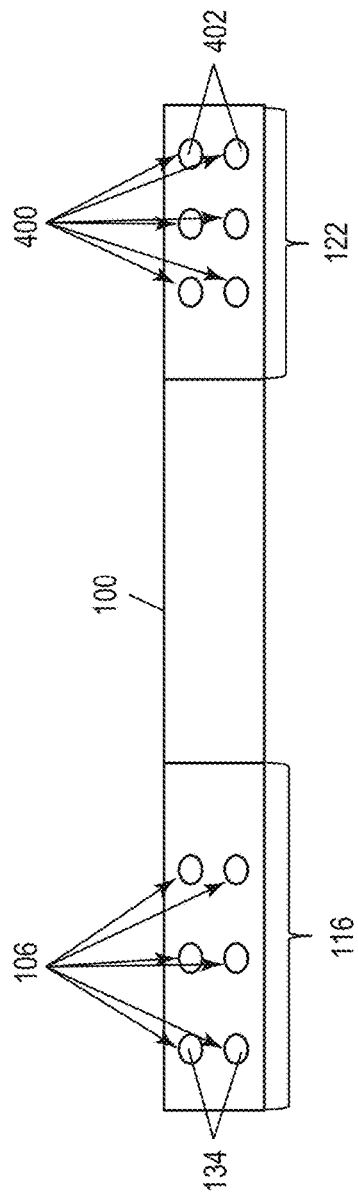

FIGS. 4A and 4B illustrate another embodiment of a method of attaching a metal clip 100 to a first bond pad 102 of a semiconductor die 104. FIG. 4A shows a cross-sectional view during the method. FIG. 4B shows a top plan view of just the metal clip 100 and resulting joints 106, 400.

The method illustrated in FIGS. 4A and 4B is similar to the method illustrated in FIGS. 1A and 1B. Different, however, the second bonding region 122 of the metal clip 100 is secured to the metal lead 126 by a wire bond joint 400 instead of a solder joint. According to this embodiment, second wire bonds 402 to the metal lead 126 are formed through corresponding openings 404 in the second bonding region 122 of the metal clip 100. After forming the second wire bonds 402, the joint 400 between the second wire bonds 401 and the metal clip 100 is formed at the side 204 of the metal clip 100 facing away from the metal lead 126. The second wire bonds 402 may be ball or wedge bonds and processed as previously described herein, e.g., using a standard wire bonding apparatus 138, to form the joint 400 between the second wire bonds 401 and the metal clip 100.

FIGS. 5A through 5C illustrate another embodiment of a method of attaching a metal clip 100 to a first bond pad 102 of a semiconductor die 104. FIG. 5A shows a cross-sectional view during the method. FIG. 5B shows a top plan view of just the metal clip 100 and resulting joints 106, 108. FIG. 5C shows a top plan view of the resulting semiconductor package 500, which may or may not be a molded package (molding compound is not shown in FIG. 2C to not obstruct most of the package components).

The method illustrated in FIGS. 5A through 5C includes the wire bond and solder joints 106, 202 for the first bonding region 116 of the metal clip 100 shown in FIGS. 2A through 2C and the wire bond joint 400 for the second bonding region 122 of the metal clip 100 shown in FIGS. 4A and 4B. The method illustrated in FIGS. 5A through 5C further includes forming a solder joint 502 between each one of the second wire bonds 402 and the metal clip 100 at the side 204 of the metal clip 100 facing away from the metal lead 126. The solder joint 502 may be formed using a solder deposition tool such as a solder printer that deposits solder 504 on each one of the second wire bonds 402 and the top side 204 of the metal clip 100, the solder 504 being reflowed or otherwise processed to form the soldered joint 502 which reinforces the underlying solder-free joint 400 between the second bonding region 122 of the metal clip 100 and the metal lead 126.

FIGS. 6A through 6C illustrate another embodiment of a method of attaching a metal clip 100 to a first bond pad 102 of a semiconductor die 104. FIG. 6A shows a cross-sectional view during the method. FIG. 6B shows a top plan view of just the metal clip 100 and resulting joints 106, 108. FIG. 6C shows a top plan view of the resulting semiconductor package 600, which may or may not be a molded package (molding compound is not shown in FIG. 2C to not obstruct most of the package components).

The method illustrated in FIGS. 6A through 6C includes the dual wire bond joints 106, 302 for the first bonding region 116 of the metal clip 100 shown in FIGS. 3A through 3C and the wire bond joint 400 for the second bonding region 122 of the metal clip 100 shown in FIGS. 4A and 4B. The method illustrated in FIGS. 6A through 6C further includes forming one or more additional wire bonds 602 between each one of the second wire bonds 402 and the metal clip 100 at the side 204 of the metal clip 100 facing away from the metal lead 126. A standard wire bonding apparatus 138 may be used to form the additional wire bonds 602.

FIGS. 7A through 7D illustrate respective cross-sectional views during different stages of an embodiment of a method of attaching a metal clip 700 such as a Cu clip to a first bond pad 702 of a semiconductor die 704. The semiconductor die 704 may be a logic die such as a processor die, memory die, etc., a power semiconductor die such as a power transistor die, a power diode die, a half bridge die, etc., or a die that combines logic and power devices on the same semiconductor substrate, e.g., as previously described herein. For example, in the case of a power semiconductor die, the first bond pad 702 may be a gate pad or a source pad.

FIG. 7A shows the semiconductor die 704 with the first bond pad 702. The semiconductor die 704 may include one or more additional bond pads at the same side of the die 704 as the first bond pad 702, and one or more bond pads at the opposite side of the die 704 as the first bond pad 702. A simplified view of the semiconductor die 704 is provided in FIGS. 7A through 7D to emphasize the clip attachment method.

FIG. 7B shows one or more first wire bonds 706 formed to the first bond pad 702 of the semiconductor die 704. A standard wire bonding apparatus may be used to form each first wire bond 134. Each first wire bond 706 may be a ball or wedge bond. That is, the proximal end 708 of each first wire bond 706 may be ball-shaped or wedge-shaped.

FIG. 7C shows the distal end 710 of each first wire bond 706 inserted through a corresponding opening 712 in a first bonding region 714 of the metal clip 700.

FIG. 7D shows, after inserting the distal end 710 of each first wire bond 706 through the corresponding opening 712 in the first bonding region 714 of the metal clip 700, forming a joint 716 between each first wire bond 706 and the metal clip 700 at a side 718 of the metal clip 700 facing away from the semiconductor die 704. According to the embodiment illustrated in FIG. 7D, the joint 716 is formed by forming one or more additional wire bonds 720 between each first wire bond 706 and the metal clip 700 at the side 718 of the metal clip 700 facing away from the semiconductor die 704. A standard wire bonding apparatus may be used to form each additional wire bond 720. Each additional wire bond 720 may be ball-shaped or wedge-shaped.

FIGS. 8A through 8D illustrate respective cross-sectional views during different stages of another embodiment of a clip attachment method. The method illustrated in FIGS. 8A through 8D is similar to the method illustrated in FIGS. 7A through 7D. Different, however, the joint 716 formed between each first wire bond 706 and the metal clip 700 is a solder joint instead of a bond wire joint. The joint 716 may be formed by applying solder 800 to the base of each first wire bond 706. The solder 800 may at least partly fill each corresponding opening 712 in the metal clip 700. The solder 800 is reflowed or otherwise processed to form the joint 716 between each first wire bond 706 and the metal clip 700.

Figure 9:
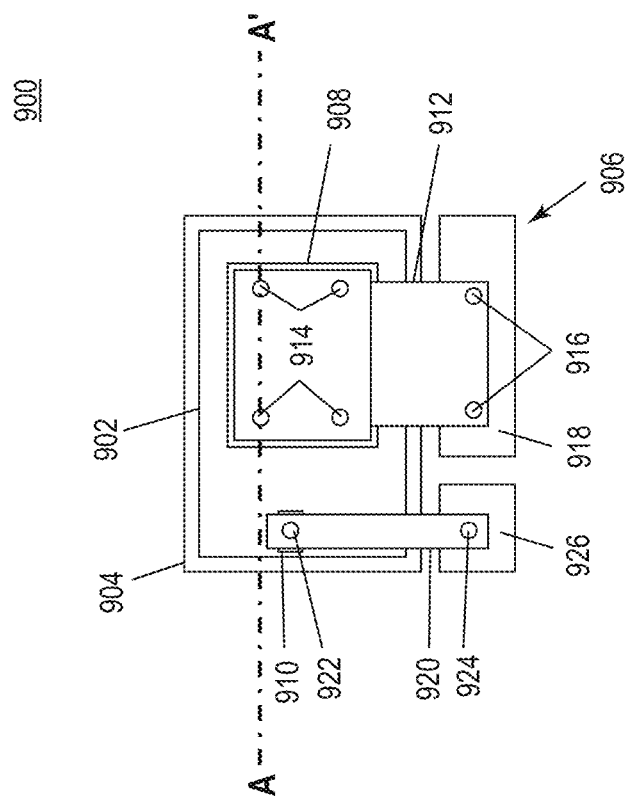
FIG. 9 illustrates a top plan view of an embodiment of a semiconductor package that includes a semiconductor die attached to a first part of a leadframe.

FIG. 9 illustrates a top plan view of an embodiment of a semiconductor package 900 that includes a semiconductor die 902 attached to a first part 904 of a leadframe 906. The semiconductor die 902 has a first bond pad 908 at a side of the semiconductor die 902 facing away from the first part 904 of the leadframe 906. The semiconductor die 902 also has a second bond pad 910 at the side as the first bond pad 908. For example, the semiconductor die 902 may be a power semiconductor die, the first bond pad 908 may be a source pad and the second bond pad 910 may be a gate pad. In the case of a vertical power device, the drain pad is at the opposite side of the die 902 and therefore out of view.

The semiconductor package 900 further includes a first metal clip 912 and one or more first wire bonds (out of view) to the first bond pad 908 of the semiconductor die 902. The first wire bonds may correspond to the first wire bonds 708 shown in FIGS. 7A through 7D and FIGS. 8A through 8D.

A distal end 914 of each first wire bond extends through a corresponding opening in a first bonding region of the first metal clip 912. A joint is formed between each first wire bond and the first metal clip 912 at the side of the first metal clip 912 facing away from the semiconductor die 904. The joint may be formed in accordance with the method illustrated in FIG. 7D for a wire bond joint or in accordance with the method illustrated in FIG. 8D for a solder joint. A similar wire bond or solder joint 916 may join the opposite end of the first metal clip 912 to a first lead 918 of the leadframe 906.

The semiconductor package 900 also includes a second metal clip 920 and one or more second wire bonds (out of view) to the second bond pad 910 of the semiconductor die 902. The second wire bonds may correspond to the first wire bonds 708 shown in FIGS. 7A through 7D and FIGS. 8A through 8D.

A distal end 922 of each second wire bond extends through a corresponding opening in a first bonding region of the second metal clip 920. A joint is formed between each second wire bond and the second metal clip 920 at the side of the second metal clip 920 facing away from the semiconductor die 904. The joint may be formed in accordance with the method illustrated in FIG. 7D for a wire bond joint or in accordance with the method illustrated in FIG. 8D for a solder joint. A similar wire bond or solder joint 924 may join the opposite end of the second metal clip 920 to a second lead 926 of the leadframe 906.

FIGS. 10A through 10E illustrate respective cross-sectional views along the line labelled A-A' in FIG. 9, during different stages of an embodiment of a method of attaching the first metal clip 912 to the first bond pad 908 of the semiconductor die 904. According to this embodiment, the semiconductor die 902 is a power semiconductor die and the first bond pad 908 is a source pad. The leadframe 906 is not shown in FIGS. 10A through 10E to emphasize the die-to-clip connections.

FIG. 10A shows the semiconductor die 904 with the first bond pad 902. A simplified view of the semiconductor die 904 is provided in FIGS. 10A through 10E to emphasize the clip attachment method.

FIG. 10B shows a plurality of first wire bonds 1000 formed to the first bond pad 902 of the semiconductor die 904. A standard wire bonding apparatus may be used to form the first wire bonds 1000. Each first wire bond 1000 may be a ball or wedge bond. That is, the proximal end 1002 of each first wire bond 1000 may be ball-shaped or wedge-shaped.

FIG. 10O shows solder 1004 applied to the first bond pad 902 of the power semiconductor. The solder 1004 may be applied by printing or any other standard solder deposition technique.

FIG. 10D shows the distal end 1106 of each first wire bond 1000 inserted through a corresponding opening 1008 in a first bonding region of the first metal clip 912. A joint is formed, via the previously applied solder 1004, between the first bond pad 902 of the semiconductor die 904 and the first bonding region of the first metal clip 912 at a side 1010 of the first metal clip 912 facing the semiconductor die 904.

FIG. 10E shows, after the distal end inserting and the soldering, a joint 1012 formed between each first wire bond 1000 and the first metal clip 912 at a side 1014 of the first metal clip 912 facing away from the semiconductor die 904. According to the embodiment illustrated in FIG. 10E, the joint 1012 is formed by forming one or more additional wire bonds between each first wire bond 1000 and the first metal clip 912 at the side 1014 of the first metal clip 912 facing away from the semiconductor die 904, e.g., in accordance with the method illustrated in FIG. 7D. A standard wire bonding apparatus may be used to form each additional wire bond which may be ball-shaped or wedge-shaped. The joint 1012 instead may be a solder joint. e.g., in accordance with the method illustrated in FIG. 8D.

Although the present disclosure is not so limited, the following numbered examples demonstrate one or more aspects of the disclosure.

Example 1. A method of attaching a metal clip to a semiconductor die, the method comprising: aligning a first bonding region of the metal clip with a first bond pad of the semiconductor die; and while the first bonding region of the metal clip is aligned with the first bond pad of the semiconductor die, forming a plurality of first wire bonds to the first bond pad of the semiconductor die through a plurality of openings in the first bonding region of the metal clip, the plurality of first wire bonds forming a joint between the metal clip and the first bond pad of the semiconductor die.

Example 2. The method of example 1, wherein aligning the first bonding region of the metal clip with the first bond pad of the semiconductor die comprises: seating the first bonding region of the metal clip in an opening of a passivation layer which laterally surrounds the first bond pad of the semiconductor die.

Example 3. The method of example 1, wherein aligning the first bonding region of the metal clip with the first bond pad of the semiconductor die comprises: seating a second bonding region of the metal clip in an alignment feature of a metal lead of a leadframe, wherein the semiconductor die is attached to a part of the leadframe that is separate and spaced apart from the metal lead.

Example 4. The method of example 3, further comprising: soldering the second bonding region of the metal clip to the metal lead.

Example 5. The method of example 3, further comprising: forming a plurality of second wire bonds to the metal lead through a plurality of openings in the second bonding region of the metal clip, the plurality of second wire bonds forming a joint between the metal clip and the metal lead; and after forming the plurality of second wire bonds, forming a joint between the plurality of second wire bonds and the metal clip at a side of the metal clip facing away from the metal lead.

Example 6. The method of example 5, further comprising: forming a solder joint between each one of the second wire bonds and the metal clip at the side of the metal clip facing away from the metal lead.

Example 7. The method of example 5, further comprising: forming one or more additional wire bonds between each one of the second wire bonds and the metal clip at the side of the metal clip facing away from the metal lead.

Example 8. The method of any of examples 1 through 7, wherein aligning the first bonding region of the metal clip with the first bond pad of the semiconductor die comprises: soldering a second bonding region of the metal clip to a metal lead of a leadframe, wherein the semiconductor die is attached to a part of the leadframe that is separate and spaced apart from the metal lead.

Example 9. The method of any of examples 1 through 8, further comprising: after forming the joint between the metal clip and the first bond pad of the semiconductor die, forming a joint between the plurality of first wire bonds and the metal clip at a side of the metal clip facing away from the semiconductor die.

Example 10. The method of example 9, wherein forming the joint between the plurality of first wire bonds and the metal clip at the side of the metal clip facing away from the semiconductor die comprises: forming a solder joint between each one of the first wire bonds and the metal clip at the side of the metal clip facing away from the semiconductor die.

Example 11. The method of example 9, wherein forming the joint between the plurality of first wire bonds and the metal clip at the side of the metal clip facing away from the semiconductor die comprises: forming one or more additional wire bonds between each one of the first wire bonds and the metal clip at the side of the metal clip facing away from the semiconductor die.

Example 12. The method of any of examples 1 through 11, wherein the plurality of openings in the first bonding region of the metal clip are countersunk or counterbored for accepting a ball or wedge head of the first wire bonds.

Example 13. The method of any of examples 1 through 12, wherein the semiconductor die is a power semiconductor die, wherein the first bond pad of the semiconductor die is a source pad of the power semiconductor die, the method further comprising: forming a wire bond connection to a gate pad of the power semiconductor die which is at the same side of the power semiconductor die as the source pad.

Example 14. A semiconductor package, comprising: a semiconductor die attached to a leadframe and having a first bond pad at a side of the semiconductor die facing away from the leadframe; a metal clip having a first bonding region attached to the first bond pad of the semiconductor die by a plurality of first wire bonds to the first bond pad of the semiconductor die and which extend through a plurality of first openings in the first bonding region of the metal clip, the plurality of first wire bonds forming a joint between the metal clip and the first bond pad of the semiconductor die; and a joint between the plurality of first wire bonds and the metal clip at a side of the metal clip facing away from the semiconductor die.

Example 15. The semiconductor package of example 14, wherein the joint between the plurality of first wire bonds and the metal clip at the side of the metal clip facing away from the semiconductor die comprises a solder joint between each one of the first wire bonds and the metal clip at the side of the metal clip facing away from the semiconductor die.

Example 16. The semiconductor package of example 14, wherein the joint between the plurality of first wire bonds and the metal clip at the side of the metal clip facing away from the semiconductor die comprises one or more additional wire bonds between each one of the first wire bonds and the metal clip at the side of the metal clip facing away from the semiconductor die.

Example 17. A method of attaching a metal clip to a semiconductor die, the method comprising: forming one or more first wire bonds to a first bond pad of the semiconductor die; inserting a distal end of each first wire bond through a corresponding opening in a first bonding region of the metal clip; and after inserting the distal end of each first wire bond through the corresponding opening in the first bonding region of the metal clip, forming a joint between each first wire bond and the metal clip at a side of the metal clip facing away from the semiconductor die.

Example 18. The method of example 17, wherein forming the joint between each first wire bond and the metal clip at the side of the metal clip facing away from the semiconductor die comprises: forming one or more additional wire bonds between each first wire bond and the metal clip at the side of the metal clip facing away from the semiconductor die.

Example 19. The method of example 17, wherein forming the joint between each first wire bond and the metal clip at the side of the metal clip facing away from the semiconductor die comprises: forming a solder joint between each first wire bond and the metal clip at the side of the metal clip facing away from the semiconductor die.

Example 20. The method of any of examples 17 through 19, wherein the semiconductor die is a power semiconductor die, and wherein the first bond pad of the semiconductor die is a gate pad of the power semiconductor die.

Example 21. The method of any of examples 17 through 19, wherein the semiconductor die is a power semiconductor die, wherein the first bond pad of the semiconductor die is a source pad of the power semiconductor die, the method further comprising: before inserting the distal end of each first wire bond through the corresponding opening in the first bonding region of the metal clip, applying solder to the source pad of the power semiconductor; and forming, via the solder, a joint between the source pad of the power semiconductor and the first bonding region of the metal clip at a side of the metal clip facing the semiconductor die.

Example 22. A semiconductor package, comprising: a semiconductor die attached to a leadframe and having a first bond pad at a side of the semiconductor die facing away from the leadframe; a metal clip; one or more first wire bonds to the first bond pad of the semiconductor die, a distal end of each first wire bond extending through a corresponding opening in a first bonding region of the metal clip; and a joint between each first wire bond and the metal clip at a side of the metal clip facing away from the semiconductor die.

Example 23. The semiconductor package of example 22, wherein the joint between each first wire bond and the metal clip at the side of the metal clip facing away from the semiconductor die comprises one or more additional wire bonds between each first wire bond and the metal clip at the side of the metal clip facing away from the semiconductor die.

Example 24. The semiconductor package of example 22, wherein the joint between each first wire bond and the metal clip at the side of the metal clip facing away from the semiconductor die comprises a solder joint between each first wire bond and the metal clip at the side of the metal clip facing away from the semiconductor die.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a semiconductor die attached to a leadframe and having a first bond pad at a side of the semiconductor die facing away from the leadframe;
a metal clip having a first bonding region attached to the first bond pad of the semiconductor die by a plurality of first wire bonds which extend through a plurality of first openings in the first bonding region of the metal clip, the plurality of first wire bonds forming a joint between the metal clip and the first bond pad of the semiconductor die; and
a joint between the plurality of first wire bonds and the metal clip at a side of the metal clip facing away from the semiconductor die.

2. The semiconductor package of claim 1, wherein the joint between the plurality of first wire bonds and the metal clip at the side of the metal clip facing away from the semiconductor die comprises a solder joint between each one of the first wire bonds and the metal clip at the side of the metal clip facing away from the semiconductor die.

3. The semiconductor package of claim 1, wherein the joint between the plurality of first wire bonds and the metal clip at the side of the metal clip facing away from the semiconductor die comprises one or more additional wire bonds between each one of the first wire bonds and the metal clip at the side of the metal clip facing away from the semiconductor die.

4. The semiconductor package of claim 1, further comprising:
a passivation layer laterally surrounding the first bond pad of the semiconductor die,
wherein the first bonding region of the metal clip is seated in an opening of the passivation layer.

5. The semiconductor package of claim 4, wherein the passivation layer confines the first bonding region of the metal clip within the first bond pad of the semiconductor die.

6. The semiconductor package of claim 4, wherein the passivation layer has a thickness of at least 20 µm.

7. The semiconductor package of claim 4, wherein the passivation layer has a thickness of at least 10% of a thickness of the metal clip.

8. The semiconductor package of claim 1, wherein a second bonding region of the metal clip is seated in an alignment feature of a metal lead of the leadframe, and wherein the semiconductor die is attached to a part of the leadframe that is separate and spaced apart from the metal lead.

9. The semiconductor package of claim 8, wherein the second bonding region of the metal clip is secured to the metal lead by a solder joint.

10. The semiconductor package of claim 8, wherein the second bonding region of the metal clip is secured to the metal lead by a wire bond joint.

11. The semiconductor package of claim 1, wherein the first wire bonds are ball bonds.

12. The semiconductor package of claim 1, wherein the first wire bonds are wedge bonds.

13. A semiconductor package, comprising:
a semiconductor die attached to a leadframe and having a first bond pad at a side of the semiconductor die facing away from the leadframe;
a metal clip;
one or more first wire bonds to the first bond pad of the semiconductor die, a distal end of each first wire bond extending through a corresponding opening in a first bonding region of the metal clip; and
a joint between each first wire bond and the metal clip at a side of the metal clip facing away from the semiconductor die.

14. The semiconductor package of claim 13, wherein the joint between each first wire bond and the metal clip at the side of the metal clip facing away from the semiconductor die comprises one or more additional wire bonds between each first wire bond and the metal clip at the side of the metal clip facing away from the semiconductor die.

15. The semiconductor package of claim 13, wherein the joint between each first wire bond and the metal clip at the side of the metal clip facing away from the semiconductor die comprises a solder joint between each first wire bond and the metal clip at the side of the metal clip facing away from the semiconductor die.

16. The semiconductor package of claim 13, further comprising:
a passivation layer laterally surrounding the first bond pad of the semiconductor die,
wherein the first bonding region of the metal clip is seated in an opening of the passivation layer.

17. The semiconductor package of claim 16, wherein the passivation layer confines the first bonding region of the metal clip within the first bond pad of the semiconductor die.

18. The semiconductor package of claim 13, wherein a second bonding region of the metal clip is seated in an alignment feature of a metal lead of the leadframe, and wherein the semiconductor die is attached to a part of the leadframe that is separate and spaced apart from the metal lead.

19. The semiconductor package of claim 18, wherein the second bonding region of the metal clip is secured to the metal lead by a solder joint.

20. The semiconductor package of claim 18, wherein the second bonding region of the metal clip is secured to the metal lead by a wire bond joint.

* * * * *